(12) United States Patent
Lim et al.

(10) Patent No.: US 9,559,080 B2
(45) Date of Patent: Jan. 31, 2017

(54) INTEGRATED CIRCUIT DEVICE PACKAGES AND METHODS FOR MANUFACTURING INTEGRATED CIRCUIT DEVICE PACKAGES

(71) Applicants: Jae-Sung Lim, Cheonan-si (KR); Ju-Hyung Kim, Seoul (KR); Jin-Wook Jeong, Asan-si (KR); Hyun-Joo Kim, Asan-si (KR); Hyouk Lee, Seoul (KR)

(72) Inventors: Jae-Sung Lim, Cheonan-si (KR); Ju-Hyung Kim, Seoul (KR); Jin-Wook Jeong, Asan-si (KR); Hyun-Joo Kim, Asan-si (KR); Hyouk Lee, Seoul (KR)

(73) Assignee: Hana Micron, Inc., Asan-si (KR)

( * ) Notice: Subject to any disclaimer, the term of this patent is extended or adjusted under 35 U.S.C. 154(b) by 107 days.

(21) Appl. No.: 14/395,116

(22) PCT Filed: Mar. 18, 2013

(86) PCT No.: PCT/KR2013/002172
§ 371 (c)(1),
(2) Date: Oct. 17, 2014

(87) PCT Pub. No.: WO2013/162173
PCT Pub. Date: Oct. 31, 2013

(65) Prior Publication Data
US 2015/0076683 A1    Mar. 19, 2015

(30) Foreign Application Priority Data

Apr. 26, 2012  (KR) .................. 10-2012-0043577
Apr. 26, 2012  (KR) .................. 10-2012-0043584
Dec. 14, 2012  (KR) .................. 10-2012-0146019

(51) Int. Cl.
*H01L 21/02*  (2006.01)
*H01L 25/065* (2006.01)
(Continued)

(52) U.S. Cl.
CPC ......... *H01L 25/0657* (2013.01); *H01L 21/768* (2013.01); *H01L 23/04* (2013.01);
(Continued)

(58) Field of Classification Search
CPC .... H01L 25/065; H01L 23/528; H01L 21/768; H01L 23/522
See application file for complete search history.

(56) References Cited

U.S. PATENT DOCUMENTS

2008/0042280 A1* 2/2008 Lin ................... H01L 23/53238
257/751
2009/0273909 A1   11/2009 Shin et al.
2010/0072634 A1*  3/2010 Ha ......................... H01L 25/16
257/787

FOREIGN PATENT DOCUMENTS

JP     11-284096     10/1999
JP     2003-007917   1/2003
(Continued)

*Primary Examiner* — Elias M Ullah
(74) *Attorney, Agent, or Firm* — Daly, Crowley, Mofford & Durkee, LLP

(57) ABSTRACT

An integrated circuit device package may include a flexible substrate having a first wiring, an integrated circuit device having a second wiring, a flexible insulation structure having a first opening and a second opening exposing the first wiring and the second wiring, respectively, a third wiring electrically connecting the first wiring to the second wiring, and a flexible protection member covering the third wiring. A stacked flexible integrated circuit device package may include a flexible substrate, a first flexible integrated circuit device including a first connection pad, a second flexible integrated circuit device including a second connection pad, a connection wiring electrically connecting the first and the second connection pads to an external device, and a flexible protection member disposed on the second flexible integrated circuit device.

18 Claims, 8 Drawing Sheets

(51) Int. Cl.
  *H01L 23/498*  (2006.01)
  *H01L 23/538*  (2006.01)
  *H01L 23/00*  (2006.01)
  *H01L 21/768*  (2006.01)
  *H01L 23/04*  (2006.01)
  *H01L 23/522*  (2006.01)
  *H01L 23/528*  (2006.01)
  *H01L 23/532*  (2006.01)
  *H01L 25/00*  (2006.01)
  *H01L 23/31*  (2006.01)

(52) U.S. Cl.
  CPC ...... *H01L 23/3135* (2013.01); *H01L 23/4985* (2013.01); *H01L 23/528* (2013.01); *H01L 23/5226* (2013.01); *H01L 23/5389* (2013.01); *H01L 23/53228* (2013.01); *H01L 23/53242* (2013.01); *H01L 23/53257* (2013.01); *H01L 23/564* (2013.01); *H01L 24/24* (2013.01); *H01L 24/82* (2013.01); *H01L 25/50* (2013.01); *H01L 23/3121* (2013.01); *H01L 24/16* (2013.01); *H01L 24/32* (2013.01); *H01L 24/73* (2013.01); *H01L 24/92* (2013.01); *H01L 2224/04105* (2013.01); *H01L 2224/16145* (2013.01); *H01L 2224/24145* (2013.01); *H01L 2224/24226* (2013.01); *H01L 2224/32145* (2013.01); *H01L 2224/32225* (2013.01); *H01L 2224/73209* (2013.01); *H01L 2224/73267* (2013.01); *H01L 2224/821* (2013.01); *H01L 2224/8203* (2013.01); *H01L 2224/9202* (2013.01); *H01L 2224/92144* (2013.01); *H01L 2224/92244* (2013.01); *H01L 2225/06513* (2013.01); *H01L 2225/06524* (2013.01); *H01L 2225/06541* (2013.01); *H01L 2924/12042* (2013.01)

(56) References Cited

FOREIGN PATENT DOCUMENTS

| | | |
|---|---|---|
| JP | 2005-116697 | 4/2005 |
| JP | 2006-165517 | 6/2006 |
| KR | 10-2004-0093436 | 11/2004 |
| KR | 10-2006-0023775 | 3/2006 |
| KR | 10-2006-0074655 | 8/2006 |
| KR | 10-2012-0043583 | 4/2012 |

* cited by examiner

INTEGRATED CIRCUIT DEVICE PACKAGES AND METHODS FOR MANUFACTURING INTEGRATED CIRCUIT DEVICE PACKAGES

CROSS REFERENCE TO RELATED APPLICATIONS

This application is a National Stage application of PCT/KR2013/002172 filed in the Korean language on Mar. 18, 2013, and entitled "INTEGRATED CIRCUIT DEVICE PACKAGES AND METHODS FOR MANUFACTURING INTEGRATED CIRCUIT DEVICE PACKAGES," which claims priority to the following Korean applications: KR10-2012-0043577 filed Apr. 26, 2012; KR10-2012-0043584 filed Apr. 26, 2012 and KR10-2012-0146019 filed Dec. 14, 2012.

BACKGROUND

1. Field

The invention relates to integrated circuit device packages and method of manufacturing integrated circuit device packages. More particularly, the invention relates to flexible integrated circuit device packages capable of being bent and spread randomly, stacked flexible integrated circuit device packages including a plurality of integrated circuit device packages, and methods of manufacturing the flexible integrated circuit device packages.

2. Related Technology

Recently, as electronic devices is widely used for many applications, packing technologies for an integrated circuit device such as a semiconductor memory device is required to ensure that a recent integrated circuit device package has a high capacity, a thin thickness, a minute size, etc. To meet the requirements of the recent integrated circuit device package, various solutions have been searched. Particularly, a flexible integrated circuit device has been developed, and thus a flexible integrated circuit device package for the flexible integrated circuit device has been developed. For example, a flexible integrated circuit device package is described in Korean Registered Patent No. 643,756. Further, the inventors have invented flexible integrated circuit device packages, and have filed the invention to Korean Intellectual Property Office as assigned Korean Patent Application Nos. 2012-0043577, 2012-0043583 and 2012-0043584.

However, current technologies for the flexible integrated circuit device package do not meet the requirements of the flexible integrated circuit device package, and thus more efficient technologies for the flexible integrated circuit device package are still required. In particular, technologies for stacked flexible integrated circuit device package including a plurality of flexible integrated circuit devices are not properly developed yet.

SUMMARY

Example embodiments of the invention provide a flexible integrated circuit device package applied at a curved or bent position.

Example embodiments of the invention provide a method of manufacturing a flexible integrated circuit device package applied at a curved or bent position.

Example embodiments of the invention provide a stacked flexible integrated circuit device package having a configuration in which flexible integrated circuit devices capable of be applied at a curved or bent position.

According to one aspect of the invention, there is provided an integrated circuit device package which may includes a flexible substrate including a first wiring for an electrical connection, an integrated circuit device disposed on the substrate, the integrated circuit device including a second wring for an electrical connection spaced apart .from the first wiring, a flexible insulation structure covering the substrate and the integrated circuit device, the flexible insulation structure having a first opening and a second opening exposing the first wiring and the second wiring, respectively, a third wiring disposed in the first opening and the second opening and on the insulation structure, the third wiring electrically connecting the first wiring to the second wiring, and a flexible protection member disposed on the insulation structure to cover the third wiring.

In example embodiments, the substrate may include a flexible printed circuit board, the insulation structure may include solder resist, polyimide composite (PIC) or a composite thereof, the third wiring may include titanium and gold, and the protection member may include a protection tape or an insulator for a flexible printed circuit board.

In example embodiments, the integrated circuit device package may additionally include an adhesion member having a film shape disposed between the substrate and the integrated circuit device so as to securing the integrated circuit device on the substrate. For example, the adhesion member may include a double-sided tape.

In example embodiments, the integrated circuit device package may additionally include a space for bending or spreading of the integrated circuit device provided between a side of the integrated circuit device and a side of the insulation structure.

According to another aspect of the invention, there is provided an integrated circuit device package which may include a flexible substrate having a first face and a second face, the substrate including a wiring for an electrical connection disposed on the second face, a flexible integrated circuit device disposed on the first lace of fixe substrate, the integrated circuit device including a wiring disposed the first face of the substrate, and an electrical connection member which contacts the wiring on the second face of the substrate, a flexible fixing member disposed between the first face of the substrate and the integrated circuit device, the flexible fixing member electrically insulating the wirings and the electrical connection member from other portions of the integrated circuit device package, and a flexible protection member disposed on the first face of the substrate to cover the integrated circuit device.

In example embodiments, the substrate may include a flexible printed circuit board, the integrated circuit device may have a thickness of 1 μm to 50 μm, the fixing member may include an adhesive material having a film shape, the protection member may include a protection tape or an insulator for a flexible printed circuit board, and each of the wiring may include copper.

In example embodiments, the integrated circuit device package may additionally include an additional wiring disposed in a through hole formed through the substrate and the fixing member. The additional wiring may electrically connect the wiring on the first face of the substrate to the wiring on the second face of the substrate.

In example embodiments, the integrated circuit device package may additionally include an insulation material electrically insulating adjacent wirings on the second face of the substrate.

According to still another aspect of the invention, there is provided method of manufacturing an integrated circuit device package. In the method, a first insulation member may be formed on a substrate including a first wiring for an electrical connection. The first insulation member may expose a portion of the substrate. A flexible integrated circuit device may be formed on the exposed portion of the substrate. The flexible integrated circuit device may include a second wiring for an electrical connection spaced apart from the first wiring. A flexible second insulation member may be formed on the first insulation member and the integrated circuit device. A first opening exposing the first wiring may be formed by partially removing the first and the second insulation members. A second opening exposing the second wiring may be formed by partially removing the second insulation member. A third wiring for electrically connecting the first wiring to the second wiring may be formed in the first and the second openings and on the second insulation member. A flexible protection member may be formed on the second insulation member to cover the third wiring.

In the formation of the integrated circuit device on the exposed portion of the substrate according to example embodiments, an adhesion member having a film shape may be additionally formed between the substrate and the integrated circuit device.

In the formation of the integrated circuit device on the exposed portion of the substrate according to example embodiments, the exposed portion of the substrate may have a width greater than a length of the integrated circuit device such that a space for bending or spreading of the integrated circuit device may be provided between a side of the integrated circuit device and a side of the first insulation member.

In example embodiments, a fixing film opposed to the integrated circuit device may be additionally attached on the substrate.

According to still another aspect of the invention, there is provided method of manufacturing an integrated circuit device package. In the method, after providing a flexible substrate including a first wiring for an electrical connection, a flexible integrated circuit device may be formed on the substrate. The flexible integrated circuit device may include a second wiring for an electrical connection spaced apart from the first wiring. A flexible insulation member may be formed on the substrate to cover the integrated circuit device. The flexible insulation member may have a first opening and a second opening exposing the first wiring and the second wiring, respectively. A third wiring for electrically connecting the first wiring to the second wiring may be formed in the first and the second openings and on the insulation member. A flexible protection member may be formed on the insulation member to cover the third wiring.

According to still another aspect of the invention, there is provided method of manufacturing an integrated circuit device package. In the method, a film for wiring may be formed on a bottom face of a flexible substrate. An integrated circuit device may be formed on an upper face of the substrate. The integrated circuit device may include an electrical connection member opposed to the film for wiring wherein a fixing member may be interposed between the upper face of the substrate and the integrated circuit device. A flexible protection member may be formed on the upper face of the substrate to cover the integrated circuit device. A through hole may be formed from the bottom face of the substrate through the fixing member to expose the electrical connection member of the integrated circuit device. A wiring may be formed on the bottom face of the substrate by patterning the film for wiring. A wiring may be formed in the through bole. The wiring may electrically connect the wiring on the bottom face of the substrate to the electrical connection member.

In example embodiments, forming the through hole may include a laser drilling process or a photolithography process.

In example embodiments, forming the wiring in the through hole may include a plating process.

According to still another aspect of the invention, there is provided a stacked flexible integrated circuit device package which may include a flexible substrate, a first flexible integrated circuit device disposed on the substrate, the first flexible integrated circuit device including a first connection pad spaced apart from the substrate, a second flexible integrated, circuit device disposed on the first flexible integrated circuit device, the second flexible integrated circuit device including a second connection pad, a connection wiring extended from the first connection pad and the second connection pad for electrically connecting the first and tire second connection pads to an external device, and a flexible protection member disposed on the second flexible integrated circuit device.

In example embodiments, each of the first and the second flexible integrated circuit devices may have a thickness of 1 μm to 50 μm.

In example embodiments, the second connection pad may be opposed to the first connection pad, and the connection wiring may include a first extended wiring and a second extended wiring being extended from the first connection pad and the second connection pad toward an outside of the first flexible integrated circuit device and an outside of the second flexible integrated circuit device, respectively. The stacked flexible integrated circuit device package may additionally include a via wiring extending from the first and the second extended wirings to a side of the substrate and/or a side of the flexible protection member.

In example embodiments, the stacked flexible integrated circuit device package may additionally include a first flexible insulation member covering the first flexible integrated circuit device to expose the first connection pad, and a second flexible insulation member covering the second flexible integrated circuit device to expose the second connection pad. The first extended wiring and the second extended wiring may extend along a surface of the first flexible insulation member and a surface of the second flexible insulation member, respectively.

In example embodiments, the second connection pad may be opposed to the first connection pad. The connection wiring may include a first via wiring contacting the first connection pad and the second connection pad, an extended wiring extending from the first via wiring toward one of an outside of the first flexible integrated circuit device and an outside of the second flexible integrated circuit device, and a second via wiring extending from the extended wiring to a side of the substrate and/or a side of the flexible protection member.

In example embodiments, the stacked flexible integrated circuit device package may additionally include a flexible insulation member covering the first and the second flexible integrated circuit devices to expose the second connection pad. The extended wiring may extend along a surface of the flexible isolation member.

In example embodiments, the second connection pad may contact the first connection pad. The connection wiring may include an extended wiring outwardly extending form the first and the second connection pads between the first and the second flexible integrated circuit devices, and a via wiring extending from the extended wiring to a side of the substrate and/or a side of the flexible protection member.

In example embodiments, the stacked flexible integrated circuit device package may additionally include a first flexible insulation member covering the first flexible integrated circuit devices to expose the first connection pad, and a second flexible insulation member covering the second flexible integrated circuit devices to expose the second connection pad. The extended wiring extends between a surface of the first flexible insulation member and a surface of the second flexible insulation member.

In example embodiments, the stacked flexible integrated circuit device package may additionally include a first adhesion member disposed between the substrate and the first flexible integrated circuit device in order to fix the first flexible integrated circuit device on the substrate, and a second adhesion member disposed between the first flexible integrated circuit device and the second flexible integrated circuit device in order to fix the second flexible integrated circuit device on the first flexible integrated circuit device.

According to example embodiments of the invention, the integrated circuit device package may include the substrate, the integrated circuit device, the insulation member, the wirings and the protection member, all of which may include flexible materials, respectively. Thus, the integrated circuit device package may be advantageously applied to a curved or bent position because the integrated circuit device package may be bent or spread in a desired random direction. Further, the stacked flexible integrated circuit device package may have a configuration in which at least two integrated circuit devices are stacked, so that the stacked flexible integrated circuit device package may be readily applied at curved or bent locations of electric or electronic apparatuses while ensuring an improved capacity and a this thickness. As a result, the stacked flexible integrated circuit device package may be employed in recent various apparatuses requiring a high capacity, a thin thickness, a small size, etc.

DESCRIPTION OF EMBODIMENTS

Figure 1:
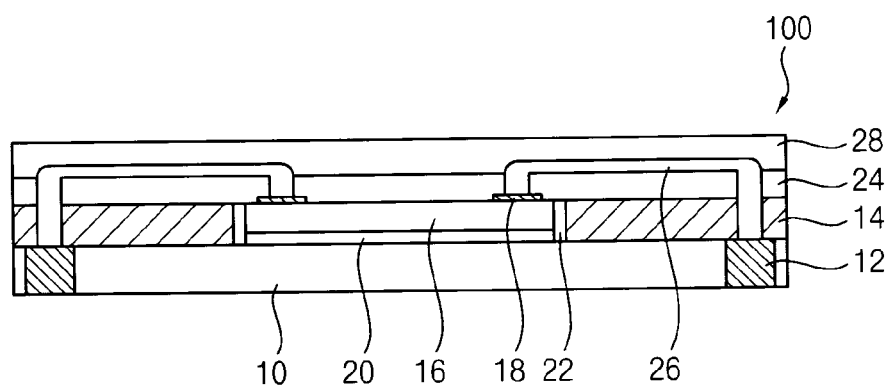
FIG. 1 is a cross-sectional view illustrating an integrated circuit device package in accordance with example embodiments of the invention.

Various embodiments will be described more fully hereinafter with reference to tire accompanying drawings, in which some embodiments are shown. The invention may, however, be embodied in many different forms and should not be construed as limited to tire embodiments set forth herein. Rather, these embodiments are provided so mat this description will be thorough and complete, and will fully convey the scope of the invention to those skilled in the art. In the drawings, the sizes and relative sizes of layers and regions may be exaggerated for clarity.

Like numerals refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from tire teachings of the invention. The terminology used herein is tor the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as baying a meaning that is consistent with their meaning in the context of the relevant art and will not be interpreted in an idealized or overly formal sense unless expressly so defined herein.

Embodiment

FIG. 1 is a cross-sectional view illustrating an integrated circuit device package is accordance with example embodiments of the invention.

Referring to FIG. 1, an integrated circuit device package 100 may include a substrate 10, a first wiring 12, a second wiring 18, a third wiring 26, an integrated circuit device 16, a first insulation member 14, a second insulation member 24, a protection member 28, etc.

The substrate 10 may include the first wiring 12 for an electrical connection. In example embodiments, the first wiring 12 may have a structure including an exposed surface for an electrical connection to other components. For example, the first wiring 12 may be composed of a metal such as copper. Additionally, the substrate 10 may include a flexible material which may be bent. For example, the substrate 10 may include a flexible printed circuit board (FPCB).

The integrated circuit device 16 may include a semiconductor device such as a memory device, non-memory device, etc. Further, the integrated circuit device 16 may include an active device and a passive device. In example embodiments, the integrated circuit device 16 may include a bendable material. For example, the integrated circuit device 16 may include a silicon substrate having a relatively thin thickness. Here, the silicon substrate for the integrated circuit device 16 may have a thickness in a range of several micrometers to scores of micrometers. In one example embodiment, the silicon substrate may have a very thin thickness of about 5 µm to about 30 µm.

As illustrated in FIG. 1, the integrated circuit device 16 may further include the second wiring 18 for an electrical connection. In this case, the second wiring 18 may include a metal such as copper. The first wiring 12 may include a material substantially the same as that of the second wiring 18, however, the first wiring 12 may include a material different from that of the second wiring 18. The second wiring 18 may be electrically connected to the first wiring 12 via the third wiring 26.

In example embodiments, the integrated circuit device 16 may be disposed on the flexible substrate 10. The second wiring 18 may be positioned over the substrate 10 and the second wiring 18 may be spaced apart from the substrate 10. The integrated circuit device 16 may be secured to the substrate 10 using an adhesion member 20 having a film shape. For example, the adhesion member 20 may include an adhesion layer or an adhesive tape, for example, a one-sided adhesive tape or a double-sided adhesive tape. The integrated circuit device 16 may be fixed on the substrate 10 by interposing this adhesion member 20 therebetween. Here, the adhesion member 20 may also have a flexibility.

The first insulation member 14 adjacent to the integrated circuit device 16 may be disposed on the substrate 10. The second insulation member 24 may be located on the first insulation member 14 to substantially cover the integrated circuit device 16. In example embodiments, the first insulation member 14 may be disposed on the substrate 10 so that the first insulation member 14 may be adjacent to the integrated circuit device 16 by interposing a space 22, which is subsequently described between the integrated circuit device 16 and the first insulation member 14. Further, the second insulation member 24 may be disposed on the first insulation member 14 and the integrated circuit device 14 to thereby define the space 22. In this case, the second insulation member 24 may cover the second wiring 18 of the integrated circuit device 16. An insulation structure including the first and the second insulation members 14 and 24 may be provided on the substrate 10 to cover the integrated circuit device 16 while ensuring the space 22 between the integrated circuit device 16 and the insulation structure. In example embodiments, each of the first and the second insulation members 14 and 24 may include a flexible material. For example, each of the first and the second insulation, members 14 and 24 may include one of solder resist, polyimide composite (PIC) and composite thereof. Moreover, the first and the second insulation members 14 and 24 may have a first opening exposing the first wiring 12 of the substrate 10, and the second insulation member 24 may have a second opening exposing the second wiring 18 of the integrated circuit device 16. The third wiring 26 positioned on the second insulation member 24 may extend the first and the second openings such that the third wiring 26 may contact the first wiring 12 and the second wiring 18. Here, the first and the second openings may be substantially filled with the third wiring 26. Therefore, the first wiring 12 may be electrically connected to the second wiring 18 via the third wiring 26, so that the substrate 10 may be electrically connected to the integrated circuit device 16. In example embodiments, the third wiring 26 may also include a flexible material. For example, the third wiring 26 may include a composite containing titanium (Ti) and gold (Au). When the third wiring 26 includes titanium, the third wiring 26 may have an improved adhesion relative to insides of the first and the second openings and a surface of the second insulation member 24. When the third wiring 26 includes gold, the third wiring 26 may have an enhanced electrical conductivity to thereby ensure a stability of an electrical connection between the first wiring 12 and the second wiring 18.

Referring now to FIG. 1, the protection member 28 may be disposed on the second insulation member 24 to cover the third wiring 26 to protect the third wiring 26. For example, the protection member 28 may substantially completely cover the third wiring 26. In example embodiments, the protection member 28 may include a bendable material For example, the protection member 28 may include a protection, tape having a film shape, or insulator foe a flexible printed circuit board.

In example embodiments, the space 22 may be provided between the side of the integrated circuit device 16 and the side of the first insulation member 14 adjacent to the integrated circuit device 16. In other words, the space 22 having a predetermined dimension may be formed between the integrated circuit device 16 and the first insulation member 14 in case that the integrated circuit device 16 is placed on the substrate 10. For example, a portion of the substrate 10 exposed by the first insulation member 14 may have a width L1 substantially greater than a width L2 of the integrated circuit device 16. When the integrated circuit device 16 is located on the substrate 10, the space 22 may be generated between the integrated, circuit device 16 and the insulation member 14. For example, spaces 22 may be provided, between both sides of the integrated circuit device 16 and both sides of the first insulation member 14. The integrated circuit device 16 may be properly bent because of the space 22. More specially, the space 22 between the side of the integrated circuit device 16 and the side of the first insulation member 14 may prevent the side of the integrated circuit device 16 from contacting tire side of the first insulation member 14 when the integrated circuit device 16 is bent and elongated in parallel relative to the substrate 10.

According to example embodiments, the insulation structure may include me first insulation member 14 and tire second insulation member 24, such that an electrical isolation between the integrated circuit device 16 and the third wiring 26 may be sufficiently ensured and also the integrated circuit device 16 may be bent randomly in the presence of the space 22. This configuration of the insulation structure will be described in detail with reference to processes for manufacturing the integrated circuit device package 100.

As described above, in the integrated circuit device package 100 according to example embodiments, ail of the substrate 10, the integrated circuit device 16, the first and the second insulation members 14 and 24, the first to the third wrings 12, 18 and 26, and the protection member 28 may include flexible materials, respectively. Thus, the integrated circuit device package 100 may be bent or spread in a random direction as occasion demands, and may be advantageously applied to a bent of spread position having a predetermined curvature.

Hereinafter, a method of manufacturing an integrated circuit device package will be described with reference to the accompanying drawings.

FIGS. 2A to 2F are cross-sectional views illustrating a method of manufacturing an integrated circuit device package in accordance with example embodiments of the invention. The method described in FIGS. 2A to 2F may manufacture an integrated circuit device package having a configuration substantially the same as that of the integrated circuit device package 100 described with reference to FIG. 1. It will be understood those ordinary skilled in the art that similar integrated circuit device packages may be manufactured by obviously modification(s) and/or variation(s) of the method.

Figure 2A:
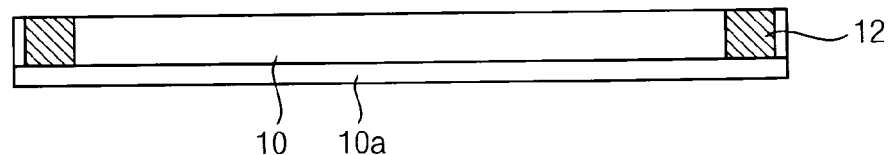
FIGS. 2A to 2F are cross-sectional views illustrating a method of manufacturing an integrated circuit device package in accordance with example embodiments of the invention.

Referring to FIG. 2A, a flexible substrate 10 may be provided. The substrate 10 may be formed using a flexible material for bending thereof. For example, the substrate 10 may include a flexible printed circuit board which has a plastic substrate and predetermined circuits formed thereon. A first wiring 12 for an electrical connection to an integrated circuit device may be formed on the substrate 10. In example embodiments, the first wiring 12 may be substantially buried at a peripheral portion of the substrate 10. Alternatively, the first wiring 12 may be formed at a desired position of the substrate 10.

According to example embodiments, a fixing film 10a may be attached on a bottom face (i.e., a face opposed to the face on which the integrated circuit device is formed). The fixing film 10a may prevent bending of the substrate 10 and components of the integrated circuit device package during manufacturing processes because the substrate 10 and these components may include flexible materials. Hence, the substrate 10 and components of the integrated circuit device package may be stably handled with ease when the fixing film 10a is provided beneath the substrate 10. The fixing film 10a may be removed from the substrate 10 after forming the integrated circuit device package on the substrate 10 as described below.

Figure 2B:
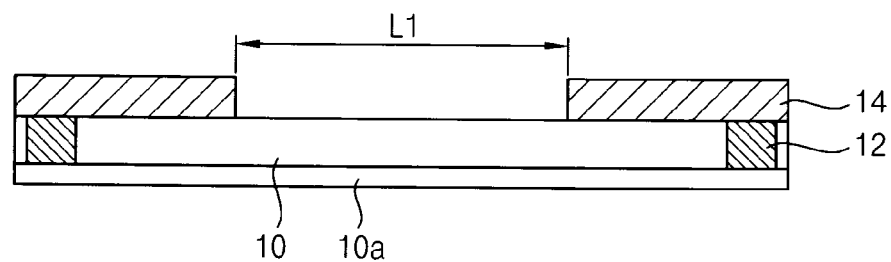

Referring to FIG. 2B, a first insulation member 14 may be formed on a portion of the substrate 10. In case that the first wiring 12 is buried in the substrate 10, the first insulation member 14 may cover the first wiring 12. For example, the first insulation member 14 may be formed at the peripheral portion of the substrate 10 considering the formation of the integrated circuit device 16 (see FIG. 2C). A central portion of the substrate 10 may be exposed in accordance with the formation of the first insulation member 14. The first insulation member 14 may be formed using a flexible material. For example, the first insulation member 14 may be formed using a solder resist, a polyimide composite (PIC), or a composite of solder resist and PIC. In example embodiments, a first insulation member layer (not illustrated) on the substrate 10, the first insulation member layer may be partially etched by a photolithography process or an etching process using an additional etching mask, to thereby form the first insulation member 14 on the substrate 10. Here, a portion of the substrate 10 (e.g., the central portion of the substrate 10) exposed by the first insulation member 14 may have a width L1 substantially greater than a length L2 of the integrated circuit device 16 successively formed. Thus, a space 22 may be generated between the first insulation member 14 and tire integrated circuit device 16.

Figure 2C:
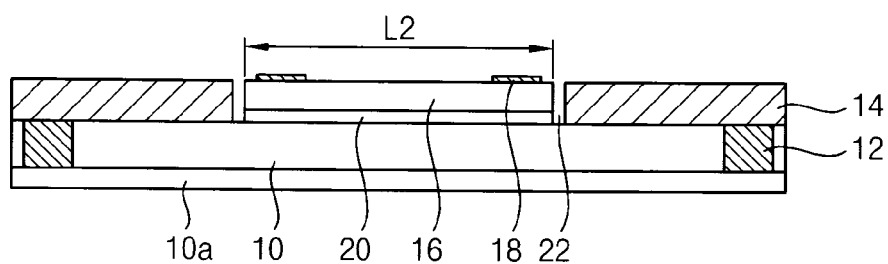

Referring to FIG. 2C, the integrated circuit device 16 including a second wiring 18 for an electrical connection may be formed on the exposed portion of the substrate 10 by the first insulation member 14. The integrated circuit device 16 may be formed using a flexible material. For example, the integrated circuit device 16 may include a silicon substrate having a relatively min thickness. In this case, the relatively this silicon substrate for the integrated circuit device 16 may have a thickness of several micrometers to scores of micrometers. In one example embodiment, the silicon substrate may have a very thin thickness in a range between about 5 µm to about 30 µm. Additionally, the second wiring 18 may include metal. For example, the second wiring 18 may be formed using copper.

In example embodiments, the integrated circuit device 16 may be formed on an upper face of the substrate 10 substantially opposed to the bottom face beneath which the fixing film 10a is located. An adhesion member 20 may be formed between the upper face of the substrate 10 and the integrated circuit device 16, and the second wiring 18 may be positioned on as upper face of the integrated circuit device 16. That is, the second wiring 18 and the adhesion member 20 may be formed on opposed feces of the integrated circuit device 16, respectively. Hence, the second wiring 18 may be exposed on the surface of the integrated circuit device 16 after the integrated, circuit device 16 may be formed on the substrate 10. The adhesion member 20 may have a film shape. The integrated circuit device 16 may be located at a predetermined portion of the substrate 10 (e.g., the central portion of the substrate 10) by means of the adhesion member 20. For example, the adhesion member 20 may be formed using a double-sided tape or a double-sided adhesion layer.

As described above, the length L2 of the integrated circuit device 16 may be substantially smaller than the width L1 of the exposed, portion of the substrate 10, such that the space 22 may be provided between a side of the integrated circuit device 16 and a side of the first insulation member 14 adjacent to the integrated circuit device 16 after forming the integrated circuit device 16 on the substrate 10. This space 22 may have a width substantially the same as a difference between the width L1 of tire exposed portion of the substrate 10 and the length L2 of the integrated circuit device 16. The width of the space 22 may be substantially increased or decreased in accordance with the material of the dimensions of the integrated circuit device 16. In example embodiments, spaces 22 may be generated between one side of the integrated circuit device 16 and one side of the first insulation member 14 arid between the other side of the integrated circuit device 16 and the other side of the first insulation member 14.

In some example embodiments, the integrated circuit device 16 may be formed on the substrate 10 by interposing the adhesion member 20 therebetween, and then the first insulation member 14 may be formed on the substrate 10 separated from the integrated circuit device 16 by the width of the space 22.

Figure 2D:
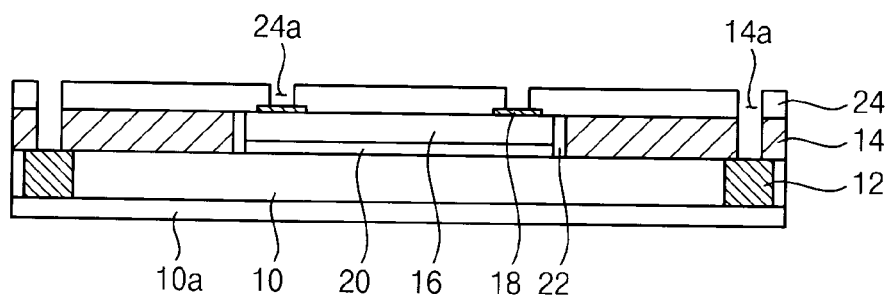

Referring to FIG. 2D, a second insulation member 24 may be formed on the first insulation member 14 and the integrated circuit device 16. The second insulation member 24 may be formed using a flexible material substantially the same as or similar to that of the first insulation member 14. For example, the second insulation member 24 may be formed using solder resist, polyimide composite (PIC) or composite of solder resist and PIC. The second insulation member 24 may have a substantially level upper face while covering the second wiring 18 of the integrated circuit device 16.

A first opening 14a exposing the first wiring 12 may be formed by partially removing the first and the second insulation members 14 and 24. Further, a second opening 24a exposing the second wiring 18 may be formed by partially removing the second insulation member 24. In example embodiments, after forming the second opening 24a by partially removing the second insulation member 24, the first opening 14a may be formed by partially removing the first and the second insulation members 14 and 24. Alternatively, the second opening 24a may be formed after forming of the first opening 14a. For example, the first and the second openings 14a and 24a may be formed by a photolithography process, a laser drilling process, etc.

Figure 2E:
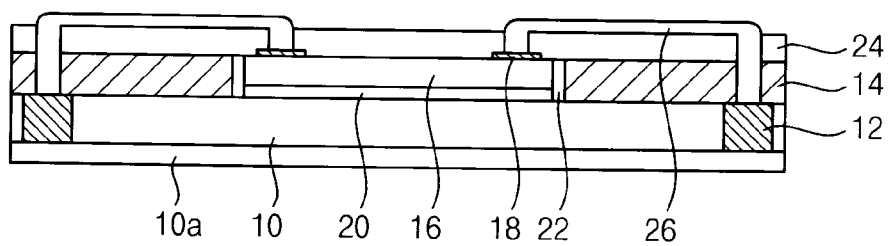

Referring to FIG. 2E, a third wiring 26 may be formed on the second insulation member 24 to fill the first opening 14a and the second opening 24a. Namely, the third wiring 26 may be formed on the second insulation member 24 to make contact with the first wiring 12 and the second wiring 18. In this case, the first and the second openings 14a and 24a may be completely filled with the third wiring 26. As the formation of the third wiring 26, the second wiring 18 of the integrated circuit device 16 may be electrically connected to the first wiring 12 of the substrate 12. For example, the third wiring 26 may be formed using a composite containing titanium and gold. When the third wiring 26 includes titanium, the third wiring 26 may have an improved adhesion relative to an inside of the first opening 14a, an inside of the second opening 24a and a surface of the second insulation member 24. That is, the third wiring 26 may have a sufficient electrical conductivity while ensuring an enhanced adhesion with respective to the insides of the first and the second openings 14a and 24a and the surface of the second insulation member 24 when the third wiring 26 includes the composite containing titanium and gold. In example embodiments, titanium may be deposited on the inside of me first opening 14a, the inside of the second opening 24a and the surface of the second insulation member 24 by a sputtering process, and then gold may be coated on the titanium by a screen printing process to obtain the third wiring 26.

Figure 2F:
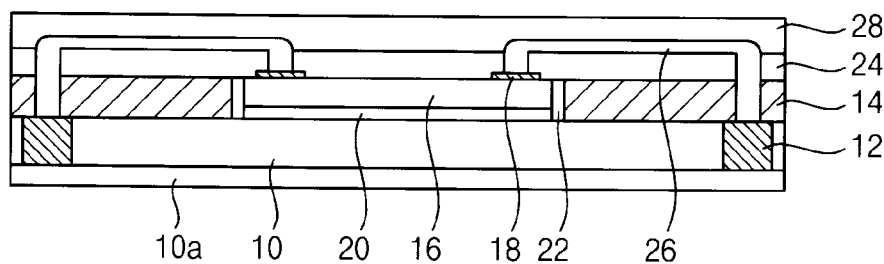

Referring to FIG. 2F, a protection member 28 may be formed on the second insulation member 24 to cover the third wiring 26. The protection member 28 may have a sufficient thickness completely covering the third wiring 26. The protection member 28 may also be formed using a flexible material. For example, the protection member 28 may be formed using a protection tape or an insulator for a flexible printed circuit board. The protection member 28 may protect the third wiring 26 from an environment.

After forming of the protection member 28, the integrated circuit device package 100 may be obtained by removing the fixing film 10a from the substrate 10.

In the illustrative method of manufacturing the integrated circuit device package 100 according to example embodiments, all of the substrate 10, the integrated circuit device 16, the first and the second insulation members 14 and 24, the third wiring 26 and the protection member 28 nay be using flexible materials, respectively. Therefore, the integrated, circuit device package 100 may be bent or spread randomly to thereby be easily applied, to a carved position, of an electronic apparatus.

Figure 3:
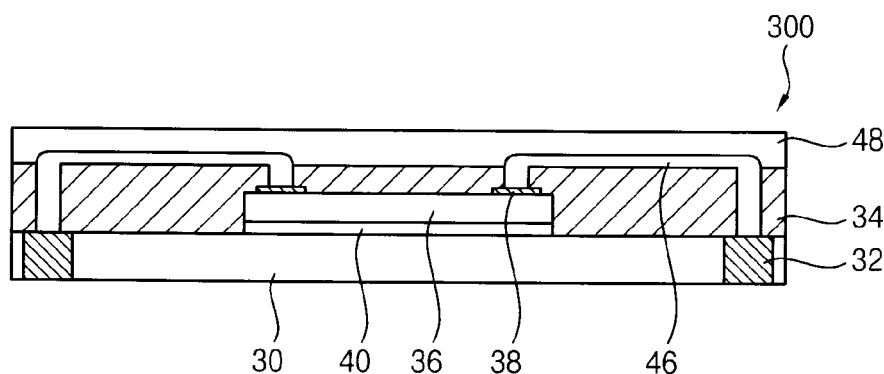
FIG. 3 is a cross-sectional view illustrating an integrated circuit device package in accordance with some example embodiments of the invention.

FIG. 3 is a cross-sectional view illustrating an integrated circuit device package in accordance with some example embodiments of the invention. FIG. 3 illustrates an integrated circuit device package 300 having a configuration substantially the same as or similar to that of the integrated circuit device package 100 described with reference to FIG. 1 except an insulation member 34 and the space 22.

Referring to FIG. 3, the integrated circuit device package 300 may include a substrate 30, an adhesion member 40, an integrated circuit device 36, the insulation member 34, a first wiring 32, a second wiring 38, a third wiring 46, a protection member 48, etc. Although the integrated circuit device package 100 in FIG. 1 may include the insulation structure having the first and the second insulation members 14 and 24, the integrated circuit device package 300 illustrated in FIG. 3 may include a single insulation member 34. Further, in the integrated circuit device package 300 illustrated in FIG. 3, the insulation member 34 may cover the integrated circuit device 36 such that the space 22 may not be provided between the insulation member 34 and the integrated circuit device 36.

In example embodiments, all of the substrate 30, the integrated circuit device 36, the insulation member 34, the third wiring 46 and the protection member 48 may include flexible materials, respectively. Such integrated circuit device package 300 may be spread, curved or bent in random directions as desired, so that the integrated circuit device package 300 may be advantageously applied to a curved, bent or a spread position of an electronic apparatus.

Hereinafter, it will be described a method of manufacturing an integrated circuit device package according to some example embodiments of the invention.

FIGS. 4A to 4E are cross-sectional views illustrating a method of manufacturing an integrated circuit device package in accordance with some example embodiments of the invention.

Figure 4A:
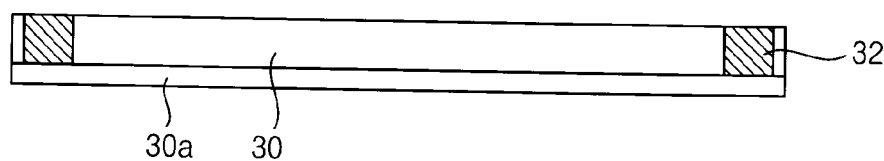
FIGS. 4A to 4E are cross-sectional views illustrating a method of manufacturing an integrated circuit device package in accordance with some example embodiments of the invention.

Referring to FIG. 4A, a substrate 30 having a first wiring 32 may be provided substantially the same as or similar to that described with reference to FIG. 2A. A removable fixing film 30a may be attached to a bottom face of the substrate 30. A first wiring 32 may be substantially buried at a peripheral portion of the substrate 30. Alternatively the first wiring 32 may be formed at a desired portion of the substrate 30.

Figure 4B:
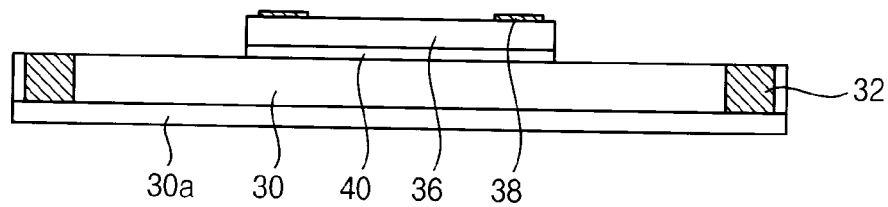

Referring to FIG. 4B, an integrated circuit device 36 may be formed on the substrate 30 while interposing an adhesion member 40 between the substrate 30 and the integrated circuit device 36. Here, the adhesion member 40 may be positioned between an upper face of the substrate 30 and a bottom face of the integrated circuit device 36, and a second wiring 38 may be located on the upper face of the substrate 30. For example, the integrated circuit device 36 may be formed on a central portion of the substrate 30. The adhesion member 40 may fix the integrated circuit device 36 on the substrate 30.

Figure 4C:
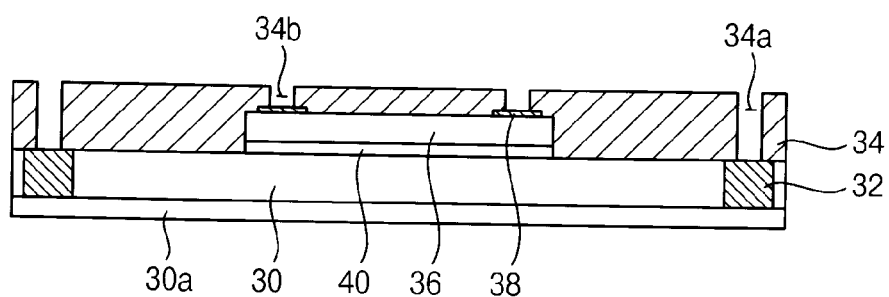

Referring to FIG. 4C, an insulation member 34 covering the integrated circuit device 36 may be formed on the substrate 30. The insulation member 34 may have a sufficient thickness completely covering the integrated circuit device 36, and also may have a substantially flat upper face. For example, the insulation member 34 may be formed using a flexible material such as solder resist, PIC, etc.

The insulation member 34 may be partially removed to form a first opening 34a and a second opening 34n through the insulation member 34. The first and the second openings 34a and 34b may expose the first and the second wirings 32 and 38, respectively. In example embodiments, an insulation layer (not illustrated) may be formed on the substrate 30 to sufficiently cover the integrated circuit device 36, and then the insulation layer may be partially removed by a photolithography process or a laser drilling process. Thus, the first opening 34 and the second opening 34b may be formed, through the insulation member 34 while forming the insulation member 34 on the substrate 30. The insulation member 34 may completely cover the integrated circuit device 35 compared to the insulation structure in FIG. 1, so that a space adjacent to the integrated circuit device 36 may not be generated.

Figure 4D:
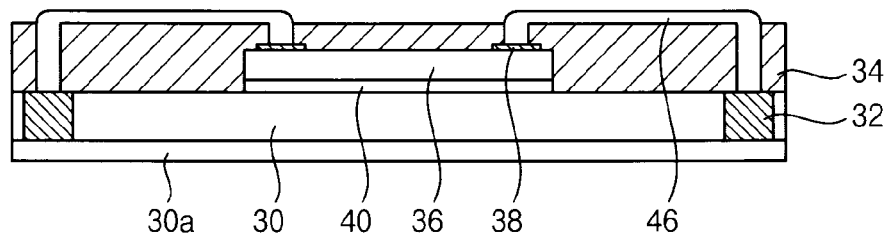

Referring to FIG. 4D, a third wiring 46 may be formed on the insulation member 34 to substantially fill the first opening 34a and the second opening 34b. That is, the third wiring 46 may be positioned on the first wiring 32, the second wiring 38 and the insulation member 34. The first wiring 32 may be electrically connected to the second wiring 38 via the third wiring 46 filling the first and the second openings 34a and 34b. The third wiring 46 may be formed using a material having an electrical conductivity and an improved adhesion as described above. For example, the third wiring 46 may contain titanium and gold deposited on insides of the first and the second openings 34a and 34b and a surface of the insulation member 34.

Figure 4E:
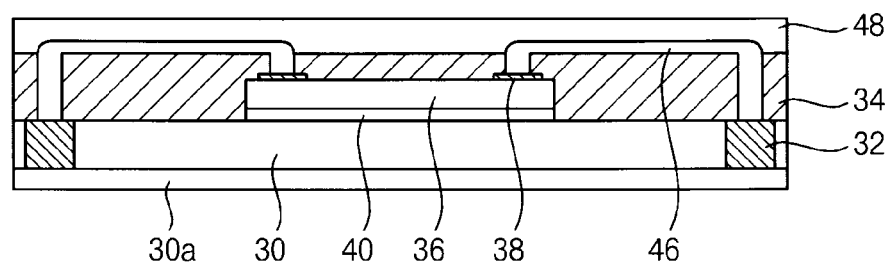

Referring to FIG. 4E, a protection member 48 may be formed on the insulation member 34 to substantially cover the third wiring 46. For example, the protection member 48 may have a substantially level upper face sufficiently covering the third wiring 46.

An integrated circuit device package 300 may be obtained by removing the fixing film 30a from the substrate 30 after forming of the protection member 48.

In the method of manufacturing the integrated circuit device package 300 according to example embodiments, the integrated circuit device package 300 may be readily applied to a curved or bent position of an electric and electronic apparatus because all of the substrate 30, the integrated circuit device 36, the insulation member 34, the third wiring 46 and the protection member 48 may be formed using flexible materials.

Figure 5:
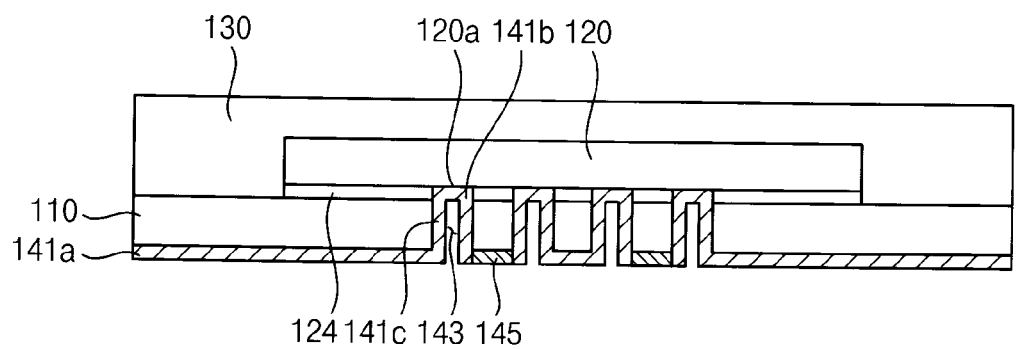
FIG. 5 is a cross-sectional view illustrating an integrated circuit device package in accordance with some example embodiments of the invention.

FIG. 5 is a cross-sectional view illustrating an integrated circuit device package in accordance with some example embodiments of the invention.

Referring to FIG. 5, the integrated circuit device package may include a substrate 110, an integrated circuit device 120, a protection member 130, a fixing member 124, etc.

The substrate 110 may have a first face (e.g., an upper face) and a second face (e.g., a bottom face). Additionally the substrate 110 may have a predetermined flexibility. For example, the substrate 110 may include a flexible printed circuit board. In example embodiments, a wiring structure may be provided on the substrate 10. The wiring structure may include a first wiring 141a, a second wiring 141b and a third wiring 141c. Here, the wiring structure may be disposed for an electrical connection from the first face of the substrate 110 to the second face of the substrate 110. The wiring structure may include the first wiring 141a disposed on the second face of the substrate 110, the second wiring 141b positioned on the first face of the substrate 110, and the thud, wiring 141c located in a through hole for electrically connecting the first wiring 141a to the second wiring 141b. For example, the first to the third wirings 141a, 141b and 141c may be obtained by a patterning process described below. Meanwhile, insulation materials may be disposed at a desired position among the first to the third wirings 141a, 141b and 141c in order to electrically insulate adjacent wirings.

In example embodiments, adjacent first wirings 141a disposed on the second face of the substrate 110 may be electrically insulated. For example, an insulation material 145 may be disposed between the adjacent first wirings 141a on the second face of the substrate 110. In some example embodiments, adjacent second wirings 141b positioned on the first face of the substrate 110 may be electrically insulated as occasion demands. For example, an additional insulation material may be provided between the adjacent second wirings 141b. Example of the insulation mater 145 for electrically insulating the adjacent first wirings 141a and/or the adjacent second wirings 151b may include solder resist.

In the integrated circuit device package illustrated in FIG. 5, the third wiring 141c may have other structures although the third wiring 141c is disposed, on a sidewall of the through hole is FIG. 5. For example, the third wiring 141c may substantially fill the through hole. The substrate 110 having tiring structure including the first to the third wirings 141a, 141b and 141c may be bent or spread since each of the first to the third wirings 141a, 141b and 141c may include a flexible material. For example, each of the first to the third wirings 141a, 141b and 141c may include metal having a predetermined electrical conductivity and flexibility.

The integrated circuit device 120 may include a semiconductor device such as a memory device or a non-memory device. Further, the integrated circuit device 120 may include an active device, a passive device, etc. The integrated circuit device 120 rosy also include a bendable material. For example, the integrated, circuit device 120 may include a silicon substrate having a relatively thin thickness. In this case, the silicon substrate may have a thickness in a range of about several micrometers to scores of micrometers. For example, the silicon substrate may have a very thin thickness of about 1 μm to about 50 μ. In one example embodiment, the integrated, circuit device 120 may have a thickness in a range between about 5 μum and about 30 μm. When the integrated circuit device 120 has a thickness below about 1 μm, the integrated circuit device 120 may not be properly formed on the substrate 110. In case that the integrated circuit device 120 may have a thickness above about 50 μm, the integrated circuit device 120 may not be desirably bent or spread.

In example embodiments, the integrated circuit device 120 may include an electrical connection member 120a for an electrical connection of the wiring structure. The electrical connection member 120a may electrically connect inner circuits of the integrated circuit device 120 to external devices through the wiring structure. For example, the electrical connection member 120a may be electrically connected to the second wiring 141b dispose don the first face of the substrate 110. The electrical connection member 120a may have a flip-chip stacked structure. In other words, the integrated circuit device package may have a flip-chip configuration using the electrical, connection member 120a without any bumps. In the integrated circuit device package having the flip-chip configuration, the electrical connection member 120a of the integrated circuit device 120 may make contact with the second wiring 141b extending on the first face of the substrate 110 via the through hole.

As illustrated in FIG. 5, the fixing member 124 may be disposed on a portion of the bottom face of the substrate 110 except a portion of the substrate 110 where the second wiring 141b makes contact with the electrical connection member 120a. That is, the fixing member 124 may be interposed between the first face of the substrate 110 and the bottom face of the integrated circuit device 120. The fixing member 124 may fix the integrated circuit device 120 on She substrate 110, and also may electrically insulate adjacent electrical connection members 120a and adjacent second wirings 141b. In this case, the second, wiring 141b may pass through the fixing member 124, and then may contact the electrical connection member 120a. In example embodiments, the fixing member 124 may also include a flexible material. For example, the fixing member 124 may have a film-shaped structure such as a double-sided tape. The integrated circuit device 120 may be securely fixed on the substrate 110 by means of the fixing member 124, and also a stability of an electrical connection between the second wiring 141b and the electrical connection member 120a may be improved.

The protection member 130 may be positioned on the first face of the substrate 110 to cover the integrated circuit device 120 in order to protect the integrated circuit device 120. The protection member 130 may have a thickness sufficiently covering the integrated circuit device 120, and may have a substantially flat upper face. The protection member 130 may also include a bendable material. For example, the protection member 130 may include a protection tape having a film shape or an insulator for a flexible printed circuit board.

As described above, in the integrated circuit device package illustrated in FIG. 5, each of the substrate 110, the integrated circuit device 120, the fixing member 124 and the protection member 130 may include the flexible material. Therefore, the integrated circuit device package may be readily applied a curved or bent position because the integrated circuit device package may be bent or spread by a desired degree.

Hereinafter, it will be described a method of manufacturing an integrated circuit device package according to some example embodiments of the invention.

FIGS. 6A to 6D are cross-sectional views illustrating a method of manufacturing an integrated circuit device package in accordance with some example embodiments of the invention. The method illustrated in FIGS. 6A to 6D may provide an integrated circuit device package having a configuration substantially the same as or similar to that of the integrated circuit device package described with reference FIG. 5, however, other integrated circuit device packages may be manufactured by those ordinary skilled in the art with obvious modifications or variations of the method illustrated in FIGS. 6A to 6D.

Figure 6A:
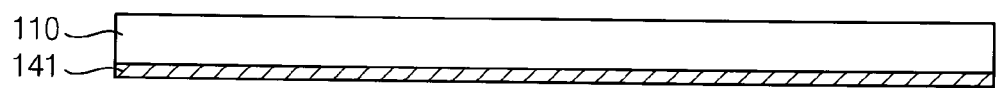
FIGS. 6A to 6D are cross-sectional views illustrating a method of manufacturing an integrated circuit device package in accordance with some example embodiments of the invention.

Referring to FIG. 6A, a substrate 110 having a first face a second face may be provided. The substrate 110 may be formed using a bendable material. For example, the substrate 110 may include a flexible printed circuit board. A film 141 for wiring may be formed on the second face (e.g., a bottom face) of the substrate 110. The film 141 for wiring may be formed using a flexible material laving a predetermined electrical conductivity such as copper. For example, the film 141 for wiring may include a copper film. This copper film may be patterned by an etching process described below, thereby forming a first wiring 141a on the second face of the substrate 110.

Figure 6B:
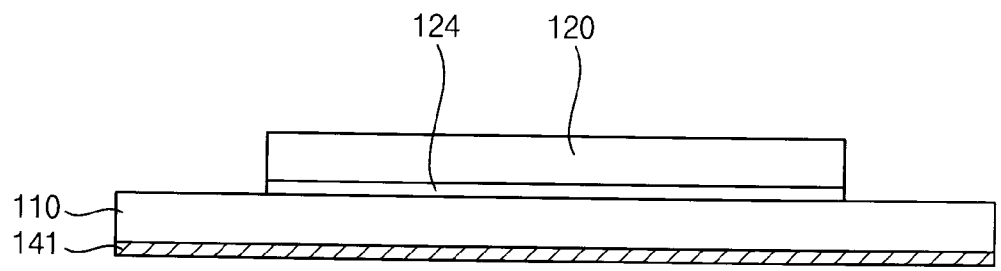

Referring to FIG. 6B, an integrated circuit device 120 may be formed on the first face of the substrate 110. In example embodiments, a bottom face of the integrated circuit device 120 may make contact with the first face of the substrate 110. An electrical connection member 120a may be provided on the bottom face of the integrated circuit device 120. The electrical connection member 120a of the integrated circuit device 120 may contact a second wiring 141b formed on the second face of the substrate 110. Here, the integrated circuit device package may have a flip-chip configuration in which the second wiring 141b on the second face of the substrate 110 may make contact with the electrical connection member 120a of the integrated circuit device 120.

According to example embodiments, a fixing member 124 may be interposed between the substrate 110 and the integrated circuit device 120. Namely, the fixing member 124 may be formed between the first face of the substrate 110 and the bottom face of the integrated circuit device 120. The fixing member 124 may be formed using a flexible material having an electric insulation. For example, the fixing member 124 may include a film shaped material such as a double-sided tape. The fixing member 124 may secure the integrated circuit device 120 on the substrate 110, and also may electrically insulate one electrical connection member 120a from another electrical connection member 120a.

Figure 6C:
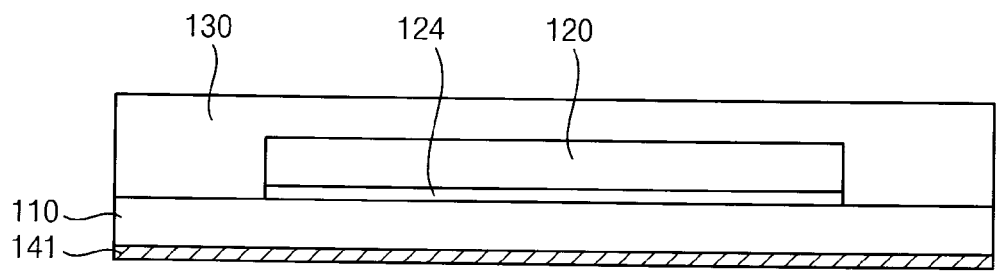

Referring to FIG. 6C, a protection member 130 may be formed on the first face of the substrate 110 having the integrated circuit device 120 thereon in order to protect the integrated circuit device 120. The protection member 130 may have a thickness sufficiently covering the integrated circuit device 120, and may have a substantially level surface. The protection member 130 may also be formed using a bendable material. For example, the protection member 130 may be formed using a protection tape having a film shape or an insulator for a flexible printed circuit board.

Figure 6D:
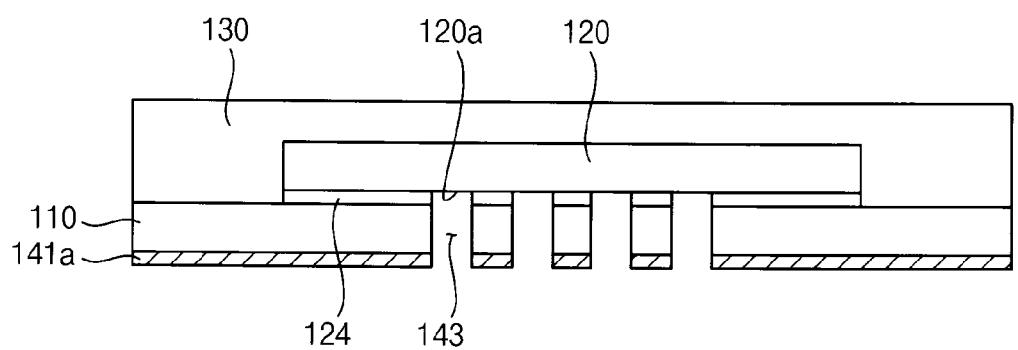

Referring to FIG. 6D, the electrical connection member 120a of the integrated circuit device 120 may be exposed by a predetermined process. In example embodiments, at least one through hole 143 may be formed from the second face of the substrate 110 to expose the electrical connection member 120a of the integrated circuit device 120. That is, the film 141 for wiring, the substrate 110 and the fixing member 124 may be partially removed to provide the through hole 143 exposing the electrical connection member 120a. For example, the through hole 143 may be formed by a laser drilling process, a photolithography process, etc. As the formation of the at least one through hole 143, the film 141 for wiring may be patterned to provide the first wiring 141a on the second face of the substrate 110.

After forming the through hole 143 and the first wiring 141a as described above, a second wiring 141b and a third wiring 141c may be formed on the exposed electrical connection member 120a and a sidewall of the through hole 143. The second wiring 141b may contact tire electrical connection member 120a, and the third wiring 141c may make contact with the first wiring 141a. In example embodiments, the second wiring 141b may be integrally formed with the third wiring 141c. For example, the second and the third wirings 141b and 141c may be formed by a plating process. When the second and the third wirings 141b and 141c are formed, the integrated circuit device 120 may be electrically connected to an external device through the electrical connection member 120a and a wiring structure including the first to the third wirings 141a, 141b and 141c. For example, when the second wiring 141b formed on the second face of the substrate 110 is electrically connected to the external device, the integrated circuit device 120 may be electrically connected to the external device the wiring structure and the electrical connection member 120a. In this case, the fixing member 124 may electrically insulate adjacent second wirings 141b and adjacent electrical connection members 120a. In some example embodiments, the third wiring 141c may substantially fill the through hole 143.

Then, as illustrated in FIG. 5, an insulation material 145 such as solder resist may be formed between the first wirings 141a positioned on the second face of the substrate 110, thereby obtaining the integrated circuit device package having a configuration substantially the same as that of the integrated circuit device package described with reference to FIG. 5. Adjacent first wirings 141a may be electrically insulated from each other by the insulation material 145.

In some example embodiments, a fixing film (not illustrated) may be formed between adjacent first wirings 141a on the second face of the substrate 110 before forming the integrated circuit device 120 on the first face of the substrate 110. Here, the fixing film may be attached to a bottom face of the film 141 for wiring. When the fixing film is provided beneath the substrate 110, processes for manufacturing the integrated circuit device package may be stably performed about the substrate 110 using flexible materials.

As described above, each of the substrate 110, the integrated circuit device 120, the fixing member 124 and the protection member 130 may be formed using flexible materials, so the integrated circuit device package having a flexibility may be advantageously applied a curved or bent positions of various apparatuses.

According to example embodiments of the invention, a stacked flexible integrated circuit device package may include a flexible substrate, flexible integrated circuit devices having a stacked configuration including a connection pad, a connection wiring, a flexible protection member, a flexible insulation member, an adhesion member, etc.

The flexible substrate may include a flexible material for bending thereof. Further, the flexible substrate may include wirings electrically connected to the flexible integrated circuit devices. Here, the wirings may be integrally formed with the flexible substrate. For example, the flexible substrate may include a flexible printed circuit board composed of polyimide, which, may include integrally formed wirings.

Each of the flexible integrated circuit devices may include a semiconductor device such as a memory device or a non-memory device. Each integrated circuit device may additionally include an active device and/or a passive device. The flexible integrated circuit devices may include bendable or flexible silicon substrates, respectively. The silicon substrate for the flexible integrated circuit device may have a thickness between several micrometers and scores of micrometers. For example, each of the flexible integrated circuit devices may have a thickness of about 1 μm to about 50 μm. In one instance, each flexible integrated circuit device may have a thin thickness in a range of about 1 μm to about 30 μm.

The integrated circuit device according to example embodiments may include a connection pad for an electrical connection to the wirings of the flexible substrate, the connection wiring and an external device. The connection pad may be exposed on a surface of the integrated circuit device.

According to example embodiments, the stacked flexible integrated circuit device package may include at least two flexible integrated circuit devices wherein the flexible integrated circuit devices may be stacked on a substrate. For example, a first flexible integrated circuit device including a first connection pad may be disposed on the substrate, and then a second flexible integrated circuit device including a second connection pad may be provided in the first flexible integrated circuit device. This configuration of the flexible integrated circuit devices will be described below.

The connection wiring may electrically connect the connection pad of the flexible integrated circuit device to the external device. The connection wising may include a flexible material having a predetermined electrical conductivity. For example, the connection wiring may include a composite containing titanium and gold. Here, titanium may improve the adhesion of the connection wiring while gold may ensure the desired electrical conductivity of the connection wiring. Further, the connection wiring may the formed by a sputtering process, a screen printing process, etc. In example embodiments, the connection wiring may have various structures in accordance with the configuration of the flexible integrated, circuit devices. The structure of the connection wiring will be described below.

The flexible protection member may be disposed on an uppermost flexible integrated circuit device in the stacked configuration of the flexible integrated circuit devices. For example, the flexible protection member may cover the uppermost flexible integrated circuit device in the stacked flexible integrated circuit device package. In this case, the flexible protection member may entirely cover the uppermost flexible integrated circuit device as well as exposed components of the stacked flexible integrated circuit device package. The flexible protection member may also include a bendable material. For example, the flexible protection member may include a protection tape or an insulator for a flexible printed circuit board.

The flexible insulation member may cover the flexible integrated circuit device except the connection pad. For example, the flexible insulation, member may cover the flexible integrated, circuit device while the flexible insulation member may have an opening exposing tire connection pad. In example embodiments, at least two flexible insulation members may cover at least two flexible integrated circuit devices, respectively. In some example embodiments, at least two flexible insulation members may cover one flexible integrated circuit device. The flexible insulation member may have various shapes in accordance with the configuration of the flexible integrated circuit devices, as described below. The flexible insulation member may also include a material capable of being bent or spread. For example, the flexible insulation member may include solder resist or polyimide composite (PIC). These may be used alone or a combination thereof.

The adhesion member may fix the flexible integrated circuit devices on the flexible substrate. For example, the first flexible integrated circuit device may be fixed on the flexible substrate using the adhesion member, and then the second flexible integrated circuit device may be fixed on the first flexible integrated circuit device using an additional adhesion member. The adhesion member may also include a flexible material. For example, the adhesion member may include a double-sided tape.

In the stacked flexible integrated circuit device package according to example embodiments, all of the flexible substrate, the stacked flexible integrated circuit devices, the connection wiring, the flexible protection member, the flexible insulation member and the adhesion member may include bendable materials, respectively. Accordingly, the stacked flexible integrated circuit device package may ensure an improved capacity while may be bent or spread.

Figure 7:
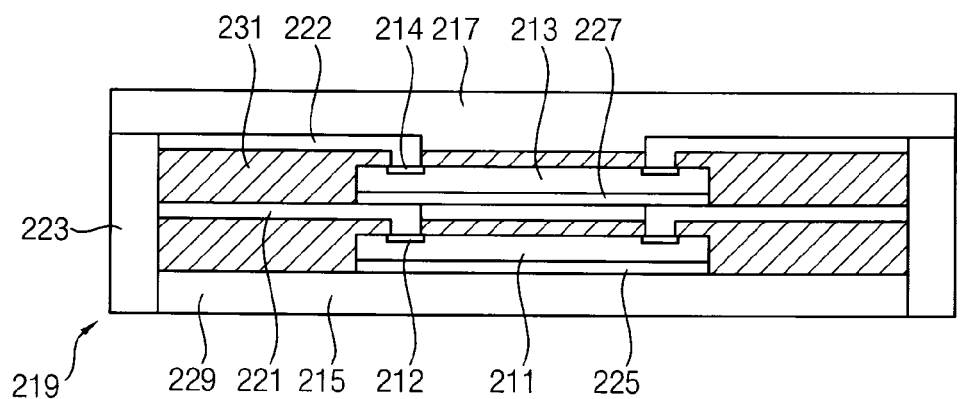
FIG. 7 is a cross-sectional view illustrating a stacked flexible integrated circuit device package in accordance with example embodiments of the invention.

FIG. 7 is a cross-sectional view illustrating a stacked flexible integrated circuit device package in accordance with example embodiments of the invention.

Referring to FIG. 7, a first flexible integrated circuit device 211 may be disposed on a flexible substrate 215 by interposing a first adhesion member 225 therebetween. The first flexible integrated circuit device 211 may include a first connection pad 212 for an electrical connection, and the first pad 212 may be opposed to the first adhesion member 225. For example, the first connection pad 212 may be exposed on an upper face of the first flexible integrated circuit device 211. The first adhesion member 225 may secure the first flexible integrated circuit device 211 on the flexible substrate 215. In example embodiments, one flexible integrated circuit device 211 may include a plurality of first connection pads 212.

A first flexible insulation member 229 may be disposed on the flexible substrate 211 on which the first flexible integrated circuit device 211 is fixed. The first flexible insulation member 229 may substantially cover the first flexible integrated circuit device 211 while exposing the first connection pad 212 of the first flexible integrated circuit device 211. The first flexible insulation member 229 may have more than one first opening which exposes the first connection pad 212, Such first flexible insulation member 229 may be formed by a laser drilling process, a photolithography process, etc.

A first extended wiring 221 may be disposed on the first flexible insulation member 229 in order to electrically connect the first flexible integrated circuit device 211 to an external device via the first connection pad 212. The first extended wiring 221 may extend from the first connection pad 212. For example, the first extended wiring 221 may extend from the first connection pad 212 to an outside of the first flexible integrated circuit device 211. Here, the first extended wiring 221 may sufficiently fill tire first opening of the first flexible insulation member 229. The first extended wiring 221 may include a material having an electrical conductivity and a flexibility, for example, copper.

Referring again to FIG. 7, a second flexible integrated circuit device 213 may be disposed on the first flexible integrated circuit device 211 by interposing a second adhesion member 227 therebetween. Thus, the first and the second flexible integrated circuit devices 211 and 213 may provide a stacked configuration. The second flexible integrated circuit device 213 may include at least one second connection pad 214 for an electrical connection to the external device. The second connection pad 214 of the second flexible integrated circuit device 213 may be opposed to the first connection pad 212 of the first flexible integrated circuit device 211. For example, the second connection pad 214 may be provided on an upper face of the second flexible integrated circuit device 213, and also nay be exposed on the upper face of the second flexible integrated circuit device 213. In example embodiments, the second, adhesion member 227 may fix the second flexible integrated circuit device 213 to the first, extended wiring 221 and the first flexible insulation member 229. In this case, a space may be provided between a central portion of the first flexible insulation member 229 and the second adhesion member 227. In some example embodiments, an additional flexible insulation material may fill this space between the first flexible insulation member 229 and the second adhesion member 227. Here, the second adhesion member 227 may be more stably fix the second flexible integrated circuit device 213 to the first flexible integrated circuit device 211.

A second flexible insulation member 231 may be disposed on the first extended wiring 221 and the first flexible insulation member 229 to cover the second flexible integrated circuit device 213. The second flexible insulation member 231 may have a sufficiently thickness completely covering the second, flexible integrated circuit device 213 while having a substantially level upper face. The second flexible insulation member 231 may have at least one second opening that exposes the second connection pad 214 of the second flexible integrated circuit device 213. The second opening of the second flexible insulation member 231 may be formed by performing a laser drilling process or a photolithography process about the second flexible insulation member 231.

A second extended wiring 222 may be disposed on the second flexible insulation member 231 so that the second flexible integrated circuit device 213 may be electrically connected to the external device via. the second connection pad 214. The second extended wiring 222 may be extended from the second connection pad 214 toward an outside of the second flexible integrated circuit device 213. Here, the second opening of the second flexible insulation member 231 may be sufficiently filled with the second extended wiring 222. For example, the second extended wiring 222 may include a material having a flexibility and an electrical conductivity such as copper.

Referring now to FIG. 7, a flexible protection member 217 may be disposed in the second flexible integrated, circuit device 213. The flexible protection member 217 may cover the second flexible insulation member 231 and the second extended wiring 222. The flexible protection member 217 may also have a substantially flat surface. The flexible integrated circuit device package 200 illustrated in FIG. 7 may have a configuration in which the second flexible integrated circuit device 213 is stacked on the first flexible integrated circuit device 211, however, the invention may not be limited to this configuration. In some example embodiments, a flexible integrated circuit device package may have a multi configuration in which, a third flexible integrated circuit device (not illustrated) and an Nth (N is a positive integer greater than 4) may be successively stacked on the second flexible integrated circuit device 213. In this case, the plurality of flexible integrated circuit devices may be stacked by the process substantially the same as or similar to that described with reference to FIG. 7. As described above, the stacked flexible integrated circuit device package 200 may include more than two stacked flexible integrated circuit devices 211 and 213.

The stacked flexible integrated circuit device package 200 may further include a via wiring 223 for electrically connecting the first and the second extended wirings 221 and 222 to tire external device. The via wiring 223 may extend to a side of the flexible substrate 215 while the via wiring 223 make electrical contact with the first and the second extended wirings 221 and 222. For example, the via wiring 223 may be positioned on the side of the flexible substrate 215, a side of the first flexible insulation member 229 and a side of the second flexible insulation member 231. Here, an upper face of the via wiring 223 may b covered with the flexible protection member 217. The via wiring 223 may be formed by filling a flexible conductive material in via holes exposing the first and the second extended wirings 221 and 222, respectively. The via wiring 223 may extend onto the side of the flexible substrate 215 as illustrated in FIG. 7, however, the via wiring 223 may extend onto a side of the flexible protection member 217 in accordance with some example embodiments.

As described above, the stacked flexible integrated circuit device package 200 may include the first extended wiring 221, the second extended wiring 222 and the via wiring 223, such that the first and the second flexible integrated circuit devices 211 and 213 may be electrically connected to the external device. Further, the stacked flexible integrated circuit device package 200 may ensure an enhanced capacity, and also may be bent or spread randomly.

Figure 8:
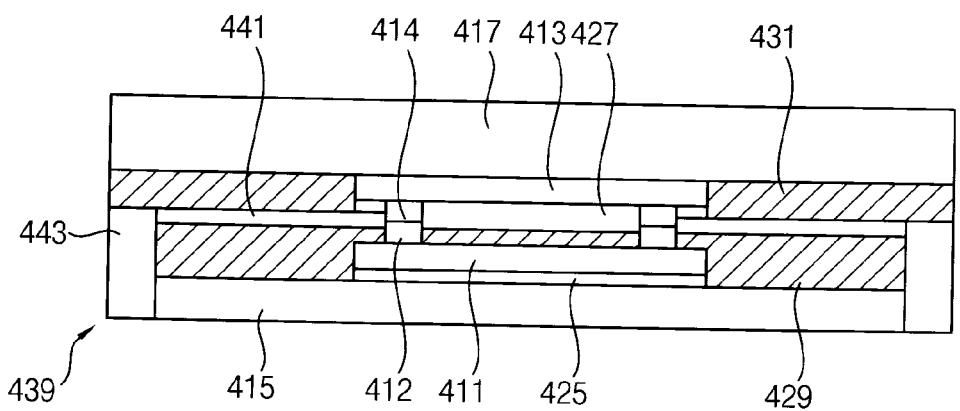
FIG. 8 is a cross-sectional view illustrating a stacked flexible integrated circuit device package in accordance with some example embodiments of the invention.

FIG. 8 is a cross-sectional view illustrating a stacked flexible integrated circuit device package in accordance with some example embodiments of the invention. The stacked flexible integrated circuit device package in FIG. 8 may have a configuration substantially the same as that of the stacked flexible integrated circuit device package 200 described with reference to FIG. 7 except a connection wiring 439 and a stacked configuration of a first flexible integrated circuit device 411 and a second flexible integrated circuit device 314.

Referring to FIG. 8, the second flexible integrated circuit device 413 may be disposed on the first flexible integrated circuit device 411 positioned on a flexible substrate 415. In this case, a first connection pad 412 of the first flexible integrated circuit device 411 may be connected to a second connection pad 414 of the second flexible integrated circuit device 413. The first connection pad 412 and the second connection pad 414 may be exposed by a first opening of a first flexible insulation member 429 and a second opening of a second flexible insulation member 431, respectively. An extended wiring 441 may make contact with the first and the second connection pads 412 and 414, so that the first and the second flexible integrated circuit devices 411 and 413 may be electrically connected to an external device through the first and the second connection pads 412 and 414 and the extended wiring 441.

A first adhesion member 425 may be disposed between the flexible substrate 415 and the first flexible integrated circuit device 411, and the first flexible integrated circuit device 411 may be covered with the first flexible insulation member 429. The second flexible insulation member 431 may be located on the first flexible insulation member 429 to cover the extended 441. A second adhesion member 427 may be interposed between the first flexible integrated circuit device 411 and the second flexible integrated circuit device 413. The second adhesion member 427 may have predetermined holes tor connecting the first connection pad 12 to the second connection pad 414. A flexible protection member 417 having a substantially level upper face may cover the second flexible integrated circuit device 413 and the second flexible insulation member 431.

As described above, the stacked flexible integrated circuit device package 400 may include the first connection pad 412 facing the second connection pad 414, such that the extended wiring 441 may extend between the first flexible insulation member 429 and the second flexible insulation member 431 while the extended wiring 441 contacts a connection, portion of the first and the second connection pads 412 and 414. Accordingly, the stacked flexible integrated circuit device package 400 may have a simple configuration by decreasing the number of the connection wirings 439. In some example embodiments, the extended wiring 441 may sufficiently fill the first opening of the first flexible insulation member 429 and the second opening of the second flexible insulation member 431.

As illustrated in FIG. 8, the stacked flexible integrated circuit device package 400 may include the via wiring 443 for electrically connecting the extended wiring 441 to the external device. The via wiring 443 may extend onto the side of the flexible substrate 415 and may make contact with the extended wiring 441. The via wiring 443 may be obtained by filling a flexible conductive material in the via hole that exposes the extended wiring 441. Alternatively, the via wiring 443 may extend, onto the side of the flexible protection member 417.

According to example embodiments, the stacked flexible integrated circuit device package 400 may include the connection wiring 439 having the extended wiring 441 and the via wiring 443, so that the stacked flexible integrated circuit device package 400 may have a simplified configuration, and also the first and the second flexible integrated circuit devices 411 and 413 may be efficiently connected to the external device.

As described above, since the stacked flexible integrated circuit device package 400 may be bent or spread randomly, the stacked flexible integrated circuit device package 400 may be readily applied to a curved or bent location while ensuring an improved capacity.

Figure 9:
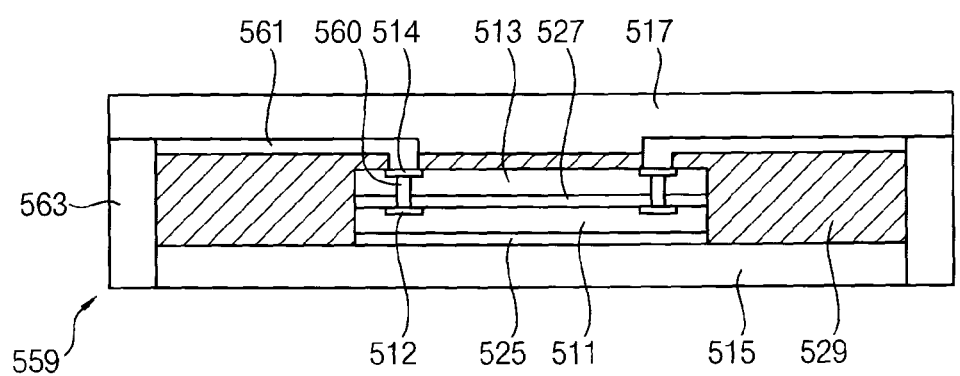
FIG. 9 is a cross-sectional view illustrating a stacked flexible integrated circuit device package is accordance with some example embodiments of the invention.

FIG. 9 is a cross-sectional view illustrating a stacked flexible integrated circuit device package in accordance with some example embodiments of tire invention. The stacked flexible integrated circuit device package in FIG. 9 may have a configuration substantially tire same as that of the stacked flexible integrated circuit device package 200 described with reference to FIG. 7 except a connection wiring 559, a flexible insulation member 529 and a stacked configuration of a first flexible integrated circuit device 511 and a second flexible integrated circuit device 513.

Referring to FIG. 9, the first flexible integrated circuit device 511 may be disposed on a flexible substrate 515 by interposing a first adhesion member 525 therebetween. The second flexible integrated circuit device 513 may be disposed on the first flexible integrated circuit device 511 by interposing a second adhesion member 517 therebetween. A first connection pad 512 of the first flexible integrated circuit device 511 may be substantially opposed to the first adhesion member 525, and a second connection pad 514 of the second flexible integrated circuit device 513 may be substantially the first connection pad 512. The first and the second flexible integrated circuit devices 511 and 513 may be fixed to the flexible substrate 515 and the first flexible integrated circuit device 511 by means of the first adhesion member 525 and the second adhesion member 527, respectively.

The flexible insulation member 529 may be disposed on the flexible substrate 515 to cover the first and the second flexible integrated circuit devices 511 and 513. Thus, the stacked flexible integrated circuit device package 500 in FIG. 9 may have a thinner thickness and a simpler configuration than those of the stacked flexible integrated circuit device package illustrated in FIG. 7. Here, the flexible insulation member 529 may have at least one opening exposing the second connection pad 514 of the second flexible integrated circuit device 513.

The stacked flexible integrated circuit device package 500 in FIG. 9 may have the configuration in which the second flexible integrated circuit device 513 is stacked, on the first flexible integrated circuit device 511, however, the invention may not be limited to this configuration. In some example embodiments, a stacked flexible integrated circuit device package may include a third flexible integrated circuit devices and an Mth (M is an integer greater than 4) flexible integrated circuit device stacked on the second, flexible integrated circuit device 513 to thereby provide a multi-stacked flexible integrated, circuit device package. When the stacked flexible integrated circuit device package includes M flexible integrated circuit devices, the flexible insulation member 529 may have a sufficiently thickness entirely covering the M flexible integrated circuit devices.

In example embodiments, the first connection pad 512 of the first flexible integrated circuit device 511 may be electrically connected to the second connection pad 514 of the second flexible integrated circuit device 513 through at least one first via wiring 560 formed in the first adhesion member 527 and the second flexible integrated circuit device 513. In case that the stacked flexible integrated circuit device package includes the M flexible integrated circuit devices, one first via wiring 560 may be formed in M−1 adhesion members and M−1 flexible integrated circuit devices, so that connection pads of the flexible integrated circuit devices may be electrically connected, to one another by the first via wiring 560.

Referring again to FIG. 9, the stacked flexible integrated circuit device package 500 may include as extended wiring 561 contacting the second connection pad 514 for electrically connecting the first via wiring 560 to an external device. The extended wiring 561 may extend from the second connection pad 514 along a surface if the flexible insulation member 529. The extended wiring 561 may sufficiently fill as opening of the flexible insulation member 529 which exposes the second connection pad 514. A flexible protection member 517 may be disposed on the flexible insulation member 529 to cover the extended wiring 561.

The stacked flexible integrated circuit device package 500 may include a second via wiring 563 for electrically connecting the extended wiring 561 to the external device. The second via wising 563 may extend a side of the flexible substrate 515 while contacting the extended wiring 561, For example, the second via wiring 563 may be formed by filling a flexi' conductive material in a via hole exposing the extended wiring 561. In some example embodiments, the second via wiring 563 may extend onto a side of the flexible protection member 529. The first flexible integrated circuit device 511 and the second flexible integrated circuit device 513 may be efficiently connected to the external device through the first via wiring 560, the extended wiring 561 and the second via wiring 563.

As described above, the stacked flexible integrated circuit device package 500 may include at least two flexible integrated circuit devices 511 and 513 in the stacked configuration. Accordingly, the stacked flexible integrated circuit device package 500 may be advantageously applied a curved or bent locations of electric and electronic apparatuses while ensuring an increased capacity, a thin thickness and a simple configuration.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An integrated circuit device package comprising:
   a flexible substrate including a first wiring for an electrical connection;
   an integrated circuit device disposed on the substrate, the integrated circuit device including a second wiring for an electrical connection spaced apart from the first wiring;
   a flexible insulation structure covering the substrate and the integrated circuit device, the flexible insulation structure having a first opening and a second opening exposing the first wiring and the second wiring, respectively;
   a third wiring disposed in the first opening and the second opening and on the insulation structure, the third wiring electrically connecting the first wiring to the second wiring; and
   a flexible protection member disposed on the insulation structure to cover the third wiring, wherein the third wiring is partially disposed on a surface of the flexible insulation structure, the first opening has a cross section with a predetermined width and is formed from a surface of the first wiring to a surface of the flexible insulation structure, the second opening is formed from a surface of the second wiring to a surface of the flexible insulation structure, and the flexible insulation structure is formed to cover an entire surface where the second wiring of the flexible integrated circuit device is disposed.

2. The integrated circuit device package of claim 1, wherein the substrate includes a flexible printed circuit board, the insulation structure includes solder resist, polyimide composite (PIC) or a composite thereof, the third wiring includes titanium and gold, the integrated circuit device has a thickness of 1 μm to 50 μm, and the protection member includes a protection tape or an insulator for a flexible printed circuit board.

3. The integrated circuit device package of claim 1, further comprising an adhesion member having a film shape disposed between the substrate and the integrated circuit device so as to securing the integrated circuit device on the substrate.

4. The integrated circuit device package of claim 3, wherein the adhesion member includes a double-sided tape.

5. The integrated circuit device package of claim 1, further comprising a space for bending or spreading of the integrated circuit device provided between a side of the integrated circuit device and a side of the insulation structure.

6. An integrated circuit device package comprising:
   a flexible substrate having a first face and a second face, the substrate including a wiring for an electrical connection disposed on the second face;
   a flexible integrated circuit device disposed on the first face of the substrate, the integrated circuit device including a wiring disposed the first face of the substrate, and an electrical connection member which contacts the wiring on the second face of the substrate;
   a flexible fixing member disposed between the first face of the substrate and the integrated circuit device, the flexible fixing member electrically insulating the wirings and the electrical connection member from other portions of the integrated circuit device package; and
   a flexible protection member disposed on the first face of the substrate to cover the integrated circuit device, wherein the electrical connection member in the flexible integrated circuit device is formed on a face contacting the flexible substrate, and the wiring disposed on a portion contacting the integrated circuit device on the first face of the substrate and the electrical connection member have a flip-chip stacked structure and make contact with each other to implement an electrical connection.

7. The integrated circuit device package of claim 6, wherein the substrate includes a flexible printed circuit board, the integrated circuit device has a thickness of 1 μm to 50 μm, the fixing member includes an adhesive material having a film shape, the protection member includes a protection tape or an insulator for a flexible printed circuit board, and each of the wiring includes copper.

8. The integrated circuit device package of claim 6, further comprising an additional wiring disposed in a through hole formed through the substrate and the fixing member, the additional wiring electrically connecting the wiring on the first face of the substrate to the wiring on the second face of the substrate.

9. The integrated circuit device package of claim 6, further comprising an insulation material electrically insulating adjacent wirings on the second face of the substrate.

10. A stacked flexible integrated circuit device package comprising:
  a flexible substrate;
  a first flexible integrated circuit device disposed on the substrate, the first flexible integrated circuit device including a first connection pad spaced apart from the substrate;
  a second flexible integrated circuit device disposed on the first flexible integrated circuit device, the second flexible integrated circuit device including a second connection pad;
  a connection wiring extended from the first connection pad and the second connection pad for electrically connecting the first and the second connection pads to an external device; and
  a flexible protection member disposed on the second flexible integrated circuit device, wherein the second connection pad is opposed to the first connection pad, the connection wiring includes a first extended wiring and a second extended wiring being extended from the first connection pad and the second connection pad toward an outside of the first flexible integrated circuit device and an outside of the second flexible integrated circuit device, respectively, the stacked flexible integrated circuit device package further comprising a via wiring extending from the first and the second extended wirings to a side of the substrate and/or a side of the flexible protection member.

11. The stacked flexible integrated circuit device package of claim 10, further comprising a first flexible insulation member covering the first flexible integrated circuit device to expose the first connection pad, and a second flexible insulation member covering the second flexible integrated circuit device to expose the second connection pad, wherein the first extended wiring and the second extended wiring extend along a surface of the first flexible insulation member and a surface of the second flexible insulation member, respectively.

12. The stacked flexible integrated circuit device package of claim 10, wherein each of the first and the second flexible integrated circuit devices has a thickness of 1 μm to 50 μm.

13. A stacked flexible integrated circuit device package comprising:
  a flexible substrate;
  a first flexible integrated circuit device disposed on the substrate, the first flexible integrated circuit device including a first connection pad spaced apart from the substrate;
  a second flexible integrated circuit device disposed on the first flexible integrated circuit device, the second flexible integrated circuit device including a second connection pad;
  a connection wiring extended from the first connection pad and the second connection pad for electrically connecting the first and the second connection pads to an external device; and
  a flexible protection member disposed on the second flexible integrated circuit device, wherein second connection pad is opposed to the first connection pad, and the connection wiring includes a first via wiring contacting the first connection pad and the second connection pad, an extended wiring extending from the first via wiring toward one of an outside of the first flexible integrated circuit device and an outside of the second flexible integrated circuit device, and a second via wiring extending from the extended wiring to a side of the substrate and/or a side of the flexible protection member.

14. The stacked flexible integrated circuit device package of claim 13, further comprising a flexible insulation member covering the first and the second flexible integrated circuit devices to expose the second connection pad, wherein the extended wiring extends along a surface of the flexible insulation member.

15. The stacked flexible integrated circuit device package of claim 13, wherein each of the first and the second flexible integrated circuit devices has a thickness of 1 μm to 50 μm.

16. A stacked flexible integrated circuit device package comprising:
  a flexible substrate;
  a first flexible integrated circuit device disposed on the substrate, the first flexible integrated circuit device including a first connection pad spaced apart from the substrate;
  a second flexible integrated circuit device disposed on the first flexible integrated circuit device, the second flexible integrated circuit device including a second connection pad;
  a connection wiring extended from the first connection pad and the second connection pad for electrically connecting the first and the second connection pads to an external device; and
  a flexible protection member disposed on the second flexible integrated circuit device, wherein the second connection pad contacts the first connection pad, and the connection wiring includes an extended wiring outwardly extending form the first and the second connection pads between the first and the second flexible integrated circuit devices, and a via wiring extending from the extended wiring to a side of the substrate and/or a side of the flexible protection member.

17. The stacked flexible integrated circuit device package of claim 16, further comprising a first flexible insulation member covering the first flexible integrated circuit devices to expose the first connection pad, and a second flexible insulation member covering the second flexible integrated circuit devices to expose the second connection pad,
  wherein the extended wiring extends between a surface of the first flexible insulation member and a surface of the second flexible insulation member.

18. The stacked flexible integrated circuit device package of claim 16, wherein each of the first and the second flexible integrated circuit devices has a thickness of 1 μm to 50 μm.

* * * * *